United States Patent [19]

Furuta

[11] Patent Number: 5,532,472
[45] Date of Patent: Jul. 2, 1996

[54] PHOTOELECTRIC SWITCH MONITORING THE DURATION OF PULSED LIGHT TO PREVENT FALSE SIGNALS DUE TO AMBIENT CONDITIONS

[75] Inventor: Naofumi Furuta, Konan, Japan

[73] Assignee: Sunx Kabushiki Kaisha, Tokyo, Japan

[21] Appl. No.: 340,385

[22] Filed: Nov. 15, 1994

[51] Int. Cl.$^6$ ...................................................... H01J 40/14
[52] U.S. Cl. ............................... 250/214 B; 250/214 SW; 250/221; 250/205
[58] Field of Search .................... 250/214 B, 214 SW, 250/221, 222.1, 559.4, 205; 340/555, 556, 557

[56] References Cited

U.S. PATENT DOCUMENTS

| | | | |
|---|---|---|---|
| 5,008,532 | 4/1991 | Ono et al. ............................ | 250/222.1 |
| 5,030,891 | 7/1991 | Ooka ................................. | 250/214 SW |
| 5,057,683 | 10/1991 | Fukuyama .......................... | 250/214 B |
| 5,126,555 | 6/1992 | Hawryluk ............................ | 250/221 |
| 5,155,350 | 10/1992 | Ottleben ............................ | 250/205 |
| 5,243,182 | 9/1993 | Murata et al. ...................... | 250/222.1 |
| 5,424,532 | 6/1995 | Occheto et al. ..................... | 250/221 |

*Primary Examiner*—Edward P. Westin
*Assistant Examiner*—Steven L. Nichols
*Attorney, Agent, or Firm*—Foley & Lardner

[57] ABSTRACT

A photoelectric switch includes a light emitting section emitting pulse light so that intensity of the emitted pulse light is sequentially increased. A light detecting section detects the pulse light emitted by the light emitting section. A light detection signal indicative of the received light is amplified and then integrated. A high-level light detection signal is delivered by the light detecting section when an integral value is equal to or above a threshold. A determination circuit delivers a first detection signal when a duration of the light detection signal is equal or above a predetermined values. The determination circuit further delivers a stable operation signal when a set time period is reached. The light detecting section is integrated into one-chip configuration.

8 Claims, 5 Drawing Sheets

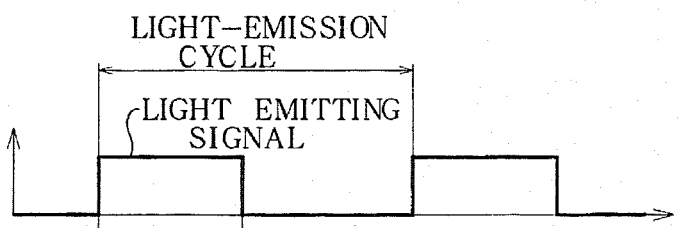
FIG. 2A $S_a$
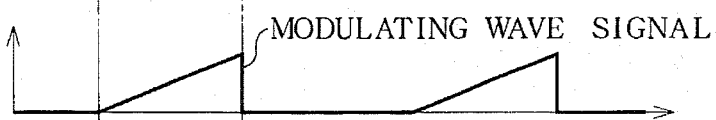
FIG. 2B $S_b$
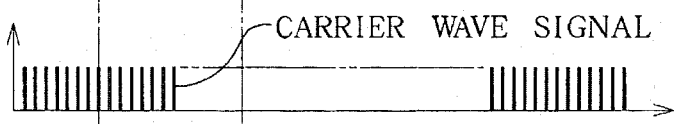
FIG. 2C $S_c$
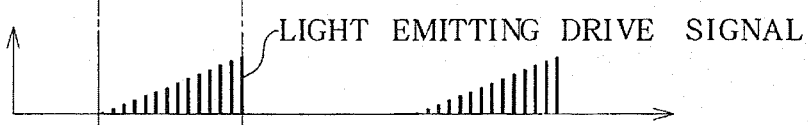
FIG. 2D $S_d$
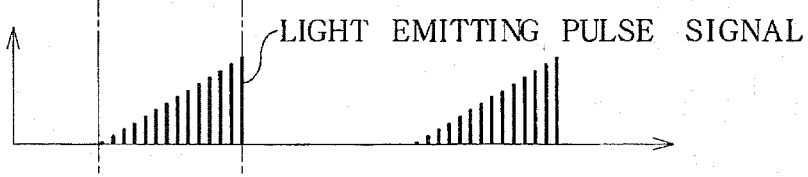
FIG. 2E $S_e$
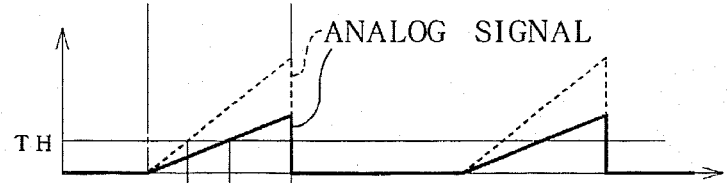
FIG. 2F $S_f$
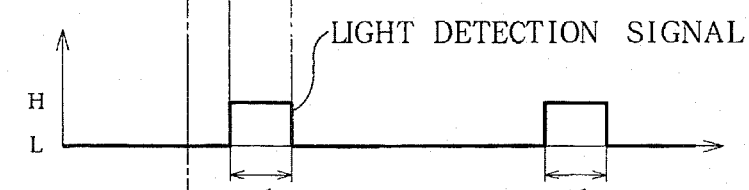
FIG. 2G $S_g$
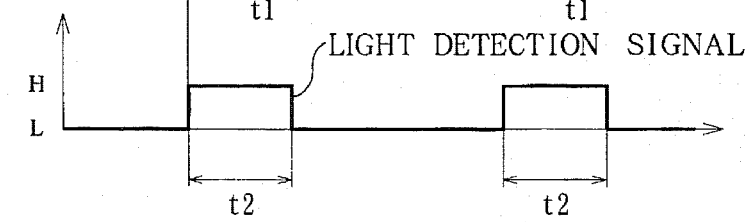
FIG. 2H $S_h$

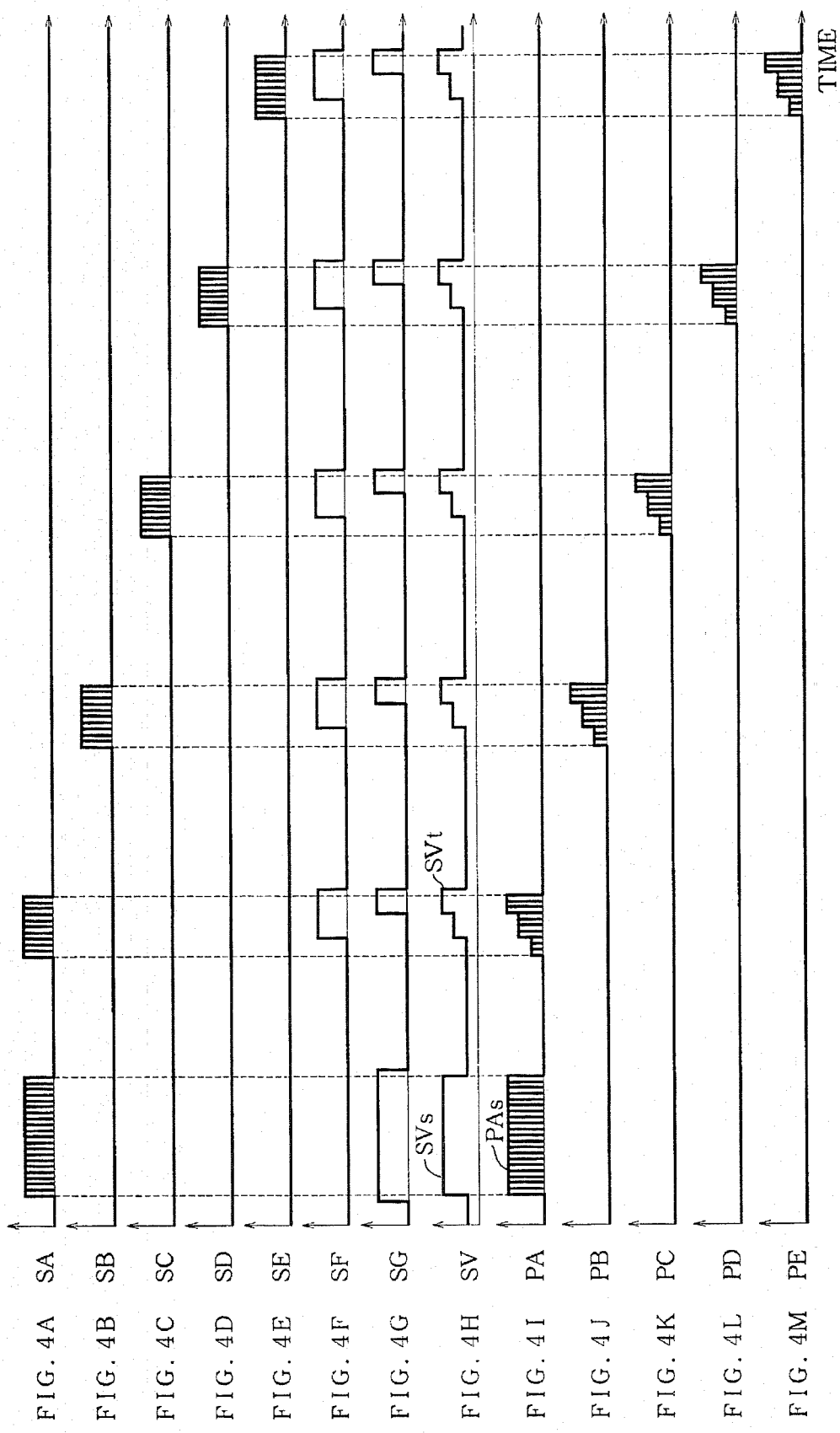

TIME

PHOTOELECTRIC SWITCH MONITORING THE DURATION OF PULSED LIGHT TO PREVENT FALSE SIGNALS DUE TO AMBIENT CONDITIONS

BACKGROUND OF THE INVENTION

1. Field of the Invention

This invention relates to a photoelectric switch wherein pulse light emitted from light emitting means is detected by light detecting means for the purpose of detecting presence or absence of an object or the like.

2. Description of the Prior Art

A photoelectric switch of the above-described type comprises a light emitting section for emitting pulse light and a light detecting section detecting the pulse light emitted by the light emitting section to thereby determine absence or presence of an object. The light detecting section comprises a light receiving element receiving the emitted pulse light, an amplifying circuit, an integrating circuit and a comparing circuit. Upon detection of the pulse light, the light receiving element converts the light energy to corresponding electrical energy, thereby generating an electric signal. The electric signal is amplified by the amplifying circuit and the amplified signal is integrated by the integrating circuit. The comparing circuit compares the integral value with a reference value and generates a detection signal indicative of detection of the pulse light when the integral value is equal to or above the reference value. In the photoelectric switch of a through-beam type, for example, no detection signal is obtained when an object interrupting the axis of an optical detecting path is present, so that the presence of the object can be detected. Furthermore, an additional comparing circuit is provided for comparing the integral value from the integrating circuit with a higher stable operation level. The additional comparing circuit generates a stable operation signal when the integral value is equal to or above the stable operation level. Thus, the state that a sufficient intensity of light is impinging upon the light detecting section can be detected.

Since the electric signal converted by the light receiving element is weak in the above-described arrangement, it is easily affected adversely by electrical noise until it is amplified by the amplifying circuit. In view of this problem, the intensity of light emitted from the light emitting section is increased or the distance between the light receiving element and the amplifying circuit is shortened. Recently, the prior art has provided for a light detecting unit formed into an integral one-chip composition comprising the light receiving element, amplifying circuit, integrating circuit and comparing circuit. In this arrangement, the distance between the light receiving element and the amplifying circuit is so short that the electric signal converted by the light receiving element is not affected adversely by the above-described electrical noise. Furthermore, the comparing circuit can be composed to generate a high-level detection signal, for example when the integral value has exceeded a predetermined level. Consequently, the detection output can be used without any processing. Additionally, the light detecting unit can be simplified and rendered small.

In the above-described one-chip light detecting unit, however, the incorporated comparing circuit is configured to necessarily compare the integral value from the integrating circuit with only one fixed reference value, thereby generating a detection signal. Accordingly, the integral value cannot be compared with another higher level and the stable operation signal as described above cannot be obtained. Furthermore, even in the above-described light detecting unit, the detection signal is generated even when a noise or an extraneous light having a relatively short period impinges upon the light receiving element and the intensity of light detected by the light receiving element has exceeded the predetermined level. When the detection signal thus obtained is used for other purposes without any processing, a false detection would occur.

SUMMARY OF THE INVENTION

Therefore, a primary object of the present invention is to provide a photoelectric switch wherein a stable operation signal indicative of the stability of the light detecting operation can be obtained as well as a detection signal indicative of presence or absence of an object interrupting an optical detecting path.

A second object of the present invention is to provide a photoelectric switch which can be prevented from generating an erroneous detection signal even when subjected to extraneous light having a relatively high intensity.

A third object of the present invention is to provide a photoelectric switch which can achieve the above-described objects in an integrated one-chip circuit configuration.

The present invention provides an improved photoelectric switch comprising light emitting means comprising light-emitting pulse signal generating means which further comprises a first circuit delivering a main pulse having a predetermined duration and an amplitude which is gradually increased, a second circuit delivering a carrier pulse signal having a predetermined amplitude, and a third circuit delivering a light-emitting pulse signal having a waveform approximately the same as that of a signal obtained by amplitude-modulating the carrier pulse signal by means of the main pulse. The photoelectric switch further comprises light detecting means comprising converting means for detecting the light signal delivered from the light emitting means and converting the detected light signal to an electric signal, integrating means for integrating the electric signal delivered from the converting means, thereby delivering a signal having an integral value, and comparing means for comparing the signal delivered from the integrating means with a reference value, thereby obtaining a light detection pulse having a duration corresponding to a period of a signal component exceeding the reference value. A determination section is provided for determining a duration of the light detection pulse delivered from the light detecting means, thereby generating first and second light-quantity indicative signals in accordance with the determined duration of the light detection pulse. The determination section comprises first determining means having a first determining value and second determining means having a second determining value which is longer than the first determining value. The first determining means compares the light detection pulse with the first determining value, thereby delivering the first light-quantity indicative signal when the duration of the light detection pulse is equal to or longer than the first determining value. The second determining means compares the light detection pulse with the second determining value, thereby delivering the second light-quantity indicative signal when the duration of the light detection pulse is equal to or longer than the second determining value.

According to the above-described arrangement, the determination section compares the duration of the light detection signal or a pulse from the light detecting means with each of a plurality of determining values and generates the light-quantity indicative signal when the duration of the light detection pulse is equal to or above the determining value. Consequently, various detection signals such as detection signals indicative of state of light detection and state of stable operation can be generated in accordance with intensity of detected light. Furthermore, even when an extraneous light impinges upon the light detecting means and a light detection signal with a shorter duration is generated, the signal is not detected by the determination section. Consequently, a precise detecting operation can be performed.

In further another form, a photoelectric switch comprises light emitting means comprising light-emitting pulse signal delivering means which further comprises a first circuit delivering a main pulse having a predetermined duration and an amplitude which is gradually increased, a second circuit delivering a carrier pulse signal having a predetermined amplitude, and a third circuit delivering first and second light-emitting pulse signals each having a phase different from the other and a waveform approximately the same as that of a signal obtained by amplitude-modulating the carrier pulse signal by means of the main pulse. The light-emitting means further comprises means for converting the first and second light-emitting pulse signals to first and second light signals respectively. The photoelectric switch further comprises light detecting means comprising converting means for detecting the first and second light signals delivered from the light emitting means and converting the detected light signals to first and second electric signals respectively, integrating means for integrating each of the first and second electric signals delivered from the converting means, thereby delivering a first and second signals having respective integral values, and comparing means for comparing each of the first and second signals delivered from the integrating means with a reference value, thereby obtaining first and second light detection pulses each having a duration corresponding to a period of a signal component exceeding the reference value. Determination means is provided for determining durations of the respective light detection pulses delivered from the light detecting means, thereby generating first and second detection signals in accordance with the determined durations of the respective first and second detection pulses. The determination section comprises first and second determining means into each of which first and second light detection pulses are input. The first determining means has a first determining value and delivers the first light-quantity indicative signal when the duration of either the first or second light detection pulse is equal to or longer than the first determining value. The second determining means has a second determining value longer than the first determining value and delivers the second light-quantity indicative signal when the duration of either the first or second light detection pulse is equal to or longer than the second determining value.

BRIEF DESCRIPTION OF THE DRAWINGS

Other objects, features and advantages of the present invention will become clear upon reviewing the following description of preferred embodiments thereof, made with reference to the accompanying drawings, in which:

FIGS. 2A to 2H are timing charts showing output state of signals shown in FIG. 1;

FIGS. 4A to 4M are timing charts showing output state of signals in a light emitting section of the photoelectric switch.

DESCRIPTION OF THE PREFERRED EMBODIMENTS

A first embodiment of the present invention will be described with reference to FIGS. 1 and 2. The invention is applied to a transmission type photoelectric switch in the first embodiment.

Figure 1:
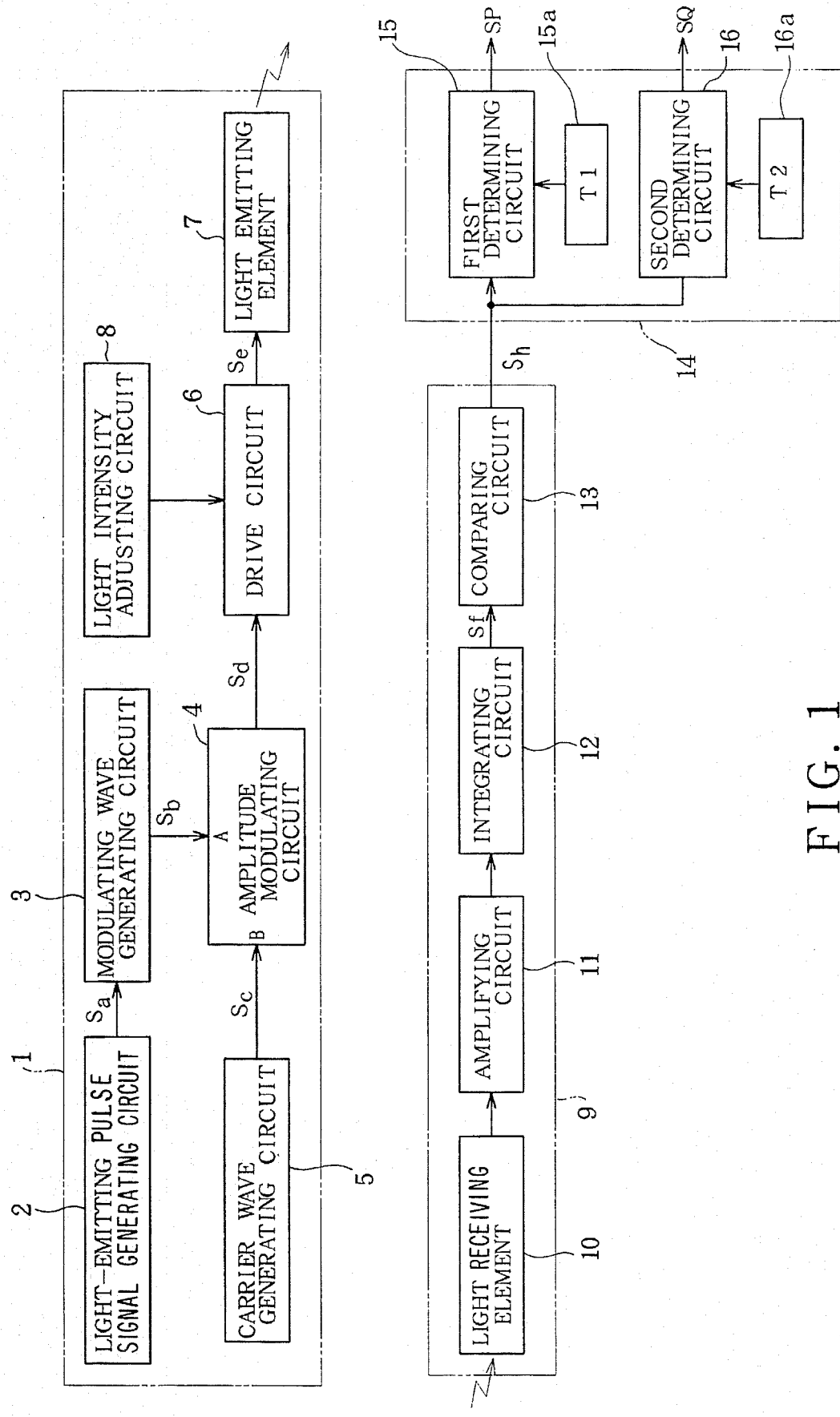
FIG. 1 is a block diagram showing an electrical arrangement of a first embodiment of a photoelectric switch in accordance with the present invention.

Referring to FIG. 1, a light emitting section 1 serving as light emitting means includes a light-emitting pulse signal generating circuit 2 having an output terminal connected through a modulating wave generating circuit 3 to an input terminal A of an amplitude modulating circuit 4. An output terminal of a carrier wave generating circuit 5 is connected to an input terminal B of the amplitude modulating circuit 4. An output terminal of the amplitude modulating circuit 4 is connected through a drive circuit 6 to a light emitting element 7 comprising LED. A light intensity adjusting circuit 8 is connected to an adjusting input terminal of the drive circuit 6. The light-emitting pulse signal generating circuit 2 delivers a rectangular light emitting pulse signal $S_a$ (see FIG. 2A) to the modulating wave generating circuit 3. The modulating wave generating circuit 3 converts the input signal $S_a$ to a triangular modulating wave signal $S_b$ as a main pulse (see FIG. 2B) whose amplitude level is sequentially increased during a period between a rise time and a fall time of the input light-emitting pulse signal $S_a$. The modulating wave signal $S_b$ is delivered to the amplitude modulating circuit 4. On the other hand, the carrier wave generating circuit 5 delivers a carrier pulse signal $S_c$ (see FIG. 2C) to the amplitude modulating circuit 4. The amplitude modulating circuit 4 amplitude-modulates the carrier pulse signal $S_c$ by means of the modulating wave signal $S_b$, thereby generating a drive signal $S_d$ (see FIG. 2D) whose amplitude is continuously increased. The drive signal $S_d$ is supplied to the drive circuit 6. A light intensity adjusting circuit 8 supplies to the drive circuit 6 a signal indicative of intensity of emitted light. The drive circuit 6 converts the input drive signal $S_d$ to a light emitting pulse signal $S_e$ (see FIG. 2E) in accordance with the signal delivered from the light intensity adjusting circuit 8. The light emitting pulse signal $S_e$ is supplied to the light emitting element 7. The light emitting element 7 emits light whose intensity is adjusted in accordance with the strength of the light emitting pulse signal $S_e$.

A light detecting unit 9 serving as light detecting means is composed into an integrated one-chip element comprising sections of a light receiving element 10, an amplifying circuit 11, an integrating circuit 12 and a comparing circuit 13. The light receiving element 10 comprises a light-sensitive diode or photodiode. Upon detection of light, the light receiving element 10 converts the received light to a corresponding electric signal. The electric signal is supplied to the amplifying circuit 11. The electric signal is amplified by the amplifying circuit 11 and is then supplied to the integrating circuit 12. The integrating circuit 12 integrates the input electric signal, thereby obtaining an analog signal $S_f$ (see FIG. 2F) having an integral value. The obtained analog signal $S_f$ is supplied to the comparing circuit 13. The comparing circuit 13 compares the input analog signal $S_f$ with a threshold value TH previously set therein. The comparing circuit 13 delivers a high-level light detection signal $S_g$ or $S_h$ (see FIGS. 2H) when the analog signal $S_f$ is above the threshold value TH.

A determination circuit 14 serving as a determination section comprises first and second determining circuits 15 and 16. The first determining circuit 15 generates a high-level pulse signal or detection signal $S_p$ as a first light-quantity indicative signal when a period of the high-level state of the light detection signal $S_g$ supplied thereto from the light receiving element 10 has reached or exceeded a first determining value $T_1$ set in a setting circuit 15a. The second determining circuit 16 also generates a high level pulse signal or stable operation signal $S_Q$ as a second light-quantity indicative signal when the period of the high-level state of the light detection signal $S_g$ has reached or exceeded a second determining value $T_2$ set in a setting circuit 16a.

The operation of the photoelectric switch will be described.

Light Emission

The light-emitting signal generating circuit 2 of the light emitting section 1 repeatedly generates the light-emitting pulse signal $S_a$ with a predetermined pulse width or a predetermined duration, as shown in FIG. 2A. When supplied with the signal $S_a$, the modulating wave generating circuit 3 converts it to the triangular modulating wave signal $S_b$ as shown in FIG. 2B so that the intensity of emitted light is continuously increased. The modulating wave pulse signal $S_b$ is delivered to the amplitude modulating circuit 4. On the other hand, the carrier wave generating circuit 5 delivers the carrier wave signal $S_c$ having a frequency sufficiently higher than the signal $S_a$, as shown in FIG. 2C. The carrier wave signal $S_c$ is supplied to the amplitude modulating circuit 4. The amplitude modulating circuit 4 generates the light emitting drive signal $S_d$, composited out of the signals $S_b$ and $S_c$, having such a pulse train that the amplitude of pulses is continuously increased, as shown in FIG. 2D. The drive signal $S_d$ is delivered to the drive circuit 6. The drive circuit 6 adjusts the amplitude of the delivered drive signal $S_d$ in accordance with the light intensity adjusting signal supplied thereto from the light intensity adjusting circuit 8, thereby delivering the light-emitting pulse signal as shown in FIG. 2E to the light emitting element 7. Consequently, the light emitting element 7 emits pulse light repeatedly at predetermined intervals.

Light Detection

Upon detection of the pulse light from the light emitting section 1, the light receiving element 10 converts the received pulse light to the electric signal corresponding to the intensity of the received pulse light. The converted electric signal is supplied to the amplifying circuit 11 to be amplified. The amplified signal is supplied to the integrating circuit 12. The amplitude of the signal supplied to the integrating circuit 12 is increased as the intensity of the pulse light received by the light receiving element 10. Since the electric signal is integrated by the integrating circuit 12, the analog signal $S_f$ indicative of the integral value takes a triangular waveform similar to that of the modulating wave pulse signal $S_b$ generated by the modulating wave generating circuit 3, as shown in FIG. 2F. As the absolute intensity of light received by the light receiving element 10 is increased, an integrated amount is increased and accordingly, a wave angle of the analog signal $S_f$ is rendered steeper. The analog signal $S_f$ is supplied to the comparing circuit 13, which compares the level of the signal $S_f$ with the predetermined threshold value TH. The comparing circuit 13 generates a high-level light detection signal $S_g$ or $S_h$ as shown in FIG. 2G or 2H when the level of the signal $S_f$ is increased to or above the threshold value TH. The light detection signal $S_g$ whose duration is $t_1$ as shown in FIG. 2G corresponds to the case where the intensity of light received by the light receiving element 10 is low while the light detection signal $S_g$ whose duration is $t_2$ as shown in FIG. 2H corresponds to the case where the intensity of light received by the light receiving element 10 is high. When the intensity of received light is low, the wave angle of the analog signal $S_f$ becomes gentle and it takes relatively much time for the signal $S_f$ to reach the reference value TH. Consequently, the duration of the signal $S_g$ is rendered longer as the intensity of received light becomes high, as shown by the durations $t_1$, $t_2$.

Determination

Upon output of the light detection signal $S_g$ or $S_h$ from the light detecting unit 9, the determining circuit 14 delivers the detection signal $S_p$ or the stable operation signal $S_Q$ in the following manner. The light detection signal $S_g$ is supplied to both first and second determining circuits 15, 16. The determining circuits 15 and 16 determine whether or not the duration $t_1$ of the signal $S_g$ is equal to or above each of the determining values $T_1$ and $T_2$ set in the respective setting circuits 15a and 16a. When the duration $t_1$ of the signal $S_g$ is equal to or above the first determining value $T_1$, the first determining circuit 15 delivers the detection signal $S_p$ as the first light-quantity indicative signal at the output terminal thereof. Thus, the presence or absence of an object interrupting the light emitted from the light emitting section 1 is received on the basis of the detection signal $S_p$ delivered from the first determining circuit 15. The detection signal $S_p$ may be used to turn on an indicating lamp or supplied to an output circuit for driving a load so that the state of detection is informed.

On the other hand, the second determining value $T_2$ ($T_2 > T_1$) for detection of the state of a stable operation of the photoelectric switch is set in the second determining circuit 16 by the setting circuit 16a, as described above. When the duration $t_1$ of the light detection signal $S_g$ is shorter than that of the second determining value $T_2$, the stable operation signal $S_Q$ as the second light-quantity indicative signal is not delivered on the basis of the signal $S_g$. Thus, since the intensity of light received by the light detecting unit 9 is not sufficient during output of the light detection signal $S_g$, the photoelectric switch is determined not to be in the stable operation state. On the other hand, output of the light detection signal $S_g$ shows that the intensity of received light is sufficient or the duration $t_1$ of the light detection signal $S_g$ is equal to or above the second determining value $T_2$ and that the stable operation signal $S_Q$ is delivered so that the photoelectric switch is determined to be in the stable operation state. The delivered stable operation signal $S_Q$ is used to indicate or display the stability of operation of the photoelectric switch.

Even where an extraneous pulse light having a relatively high level of intensity impinges upon the light receiving element 10, a light detection signal $S_g$ may be delivered erroneously from the light detecting unit 9 if the integral value reaches the threshold value TH. Subsequently, the first determining circuit 15 determines whether or not output of the signal $S_g$ continues for the first determining value $T_1$ or above. However, since the duration of the extraneous pulse light is generally short, the duration of the signal $S_g$ delivered from the light detecting means 9 in response to the extraneous pulse light is shorter than the determining time $T_1$ set in the setting circuit 15a. Consequently, the erroneous signal generated in response to the extraneous pulse light is not delivered from the determination section 14.

As obvious from the foregoing, since the duration of the detection signal $S_g$ is determined on the basis of the intensity of the received light, the duration of the detection signal $S_g$ can be compared with a plurality of reference values such as the determining values $T_1$, $T_2$. Consequently, the intensity of the received light and the electric signal indicative of the intensity of the received light can be distinguished and displayed at a plurality of levels.

Although the two determining values $T_1$, $T_2$ are set in the determination circuit 14 in the foregoing embodiment, three or more such determining values may be employed and three or more different detection signals may be delivered.

Figure 3:
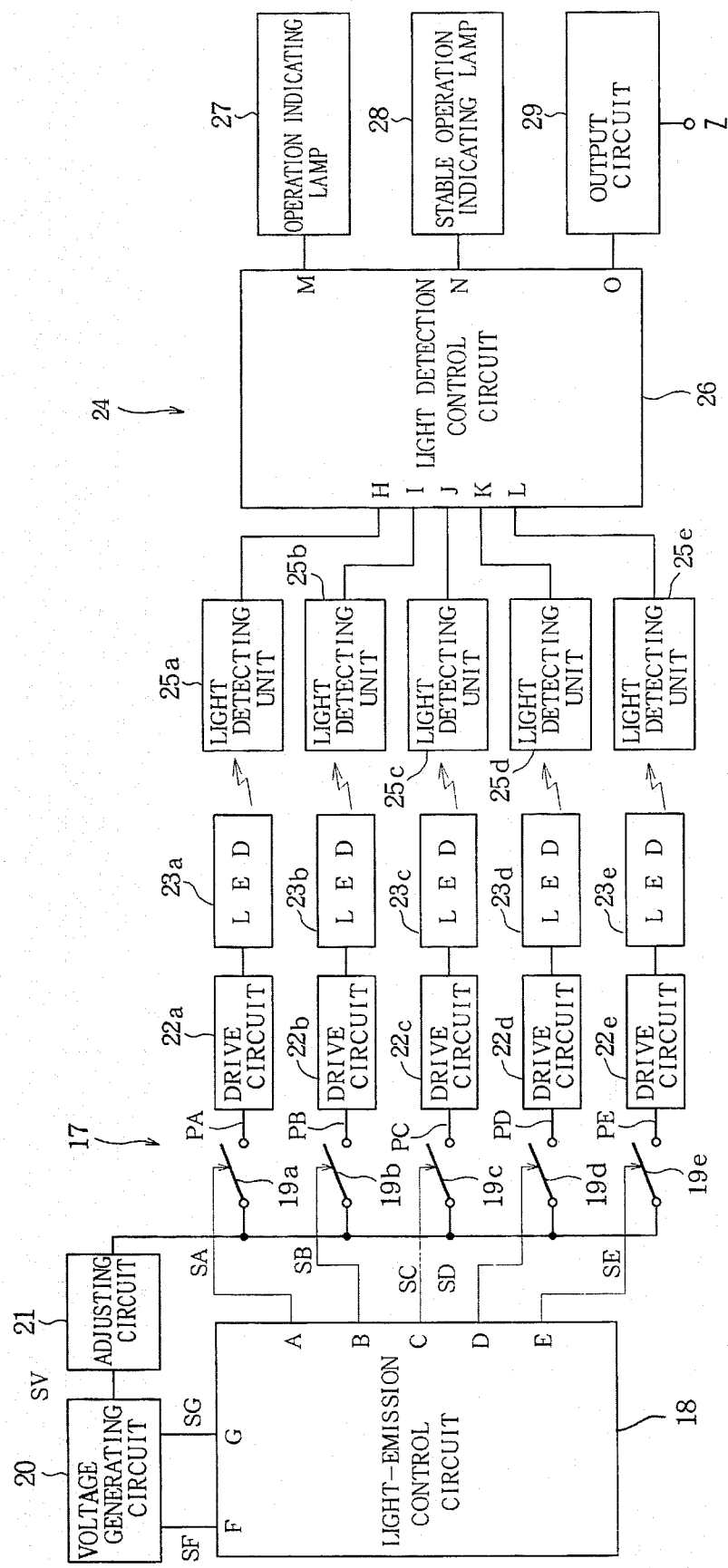
FIG. 3 is a block diagram showing an electrical arrangement of a second embodiment of a photoelectric switch in accordance with the present invention.

FIGS. 3 to 5 illustrate a second embodiment of the invention. In the second embodiment, the invention is applied to an area sensor of the type having five optical detecting paths. Referring to FIG. 3, a light emitting section 17 serving as the light emitting means includes a light emission control circuit 18 for controlling the light emitting operation. The control circuit 18 comprises a microcomputer, read-only memories, random-access memories and the like. A control program for controlling the light emitting operation is previously stored in the light emission control circuit 18. Output terminals A to E of the light emission control circuit 18 are connected to control input terminals of five switching circuits 19a to 19e respectively. Each of the switching circuits 19a–19e is arranged to perform the same operation as that of the amplitude modulating circuit 4 in FIG. 1 although each of them is shown in the form of a control symbol in FIG. 3. Output terminals F and G of the light emission control circuit 18 are connected to respective input terminals of a voltage generating circuit 20. Based on signals $S_F$ and $S_G$ supplied from the light emission control circuit 18, the voltage generating circuit 20 delivers a voltage signal as the light-emitting pulse signal based on the signal given from the light-emission control circuit. An output terminal of the voltage generating circuit 20 is connected through an adjusting circuit 21 to input terminals of the respective switching circuits 19a–19e. Output terminals of the switching circuits 19a–19e are connected through drive circuits 22a to 22e to light-emitting diodes or LEDs 23a to 23e serving as light emitting elements, respectively.

The arrangement of a light detecting section 24 will be described. Five light detecting units 25a to 25e each serving as light detecting means are arranged so that optical detecting paths are provided between them and the LEDs respectively. Each of the light detecting units 25a–25e comprises the sections of the light receiving element, amplifying circuit, integrating circuit and comparing circuit as in the light detecting unit 9 in the foregoing embodiment. A light detection control circuit 26 serving as the determination means comprises the microcomputer, ROMs, RAMs and the like. A determination program is previously stored in the light detection control circuit 26. Input terminals H to L of the light detection control circuit 26 are connected to output terminals of the respective light detecting units 25a–25e. Output terminals M to O of the light detection control circuit 26 are connected to input terminals of an operation indicating lamp 27, a stable operation indicating lamp 28 and an output circuit 29 respectively. The operation indicating lamp 27 is turned on upon input thereto of a signal indicative of presence of an object. The stable operation indicating lamp 28 is turned on upon input thereto of a signal indicative of a stable operation state of the area sensor. The output circuit 29 delivers an object detection signal at its output terminal Z upon input thereto of the signal indicative of presence of the object.

The operation of the area sensor will be described with reference to FIGS. 4 and 5.

Light Emission

In the light emitting section 17, the light emission control circuit 18 delivers at the output terminals F, G the digital signals $S_F$, $S_G$ whose output timings are previously determined, as shown in FIGS. 4F and 4G, respectively. The voltage generating circuit 20 delivers a voltage signal $S_V$ having a step-wise waveform as the light-emitting pulse signal in accordance with the composition of the digital signals $S_F$, $S_G$. The voltage signal $S_V$ contains a synchronous signal $S_{V_S}$ and light emitting signals $SV_i$ corresponding to the five optical detecting paths in one cycle thereof and is repeated at predetermined intervals. The voltage signal $S_V$ is supplied to the adjusting circuit 21, which adjusts the voltage so that it takes a proper level. The voltage signal $S_V$ is supplied from the adjusting circuit 21 to the input terminals of the respective switching circuits 19a–19e. The voltage level of the light-emitting pulse signal of the voltage signal $S_V$ corresponding to each light emitting operation is changed in three stages so that the intensity of light emitted from each LED 23a–23e is increased stepwise.

The light emission control circuit 18 delivers at the output terminals A to E carrier pulse signals $S_A$ to $S_E$ each having respective phase different from one another and a short cycle period as shown in FIGS. 4A–4E. In the switching circuits 19a–19e, the carrier pulse signals $S_A$–$S_E$ is amplitude-modulated by means of the voltage signal $S_V$ delivered from the adjusting circuit 21 respectively. Consequently, amplitude-modulated light emitting pulse signals $P_A$ to $P_E$ as shown in FIGS. 4I–4M are supplied to the drive circuits 22a–22e. A synchronous pulse signal $P_{A_S}$ corresponding to the voltage signal $S_{V_S}$ is contained in the light emitting pulse signal $P_A$. Drive currents are supplied from the drive circuits 22a–22e to LEDs 23a–23e respectively so that the intensity of light is increased stepwise according to waveforms of the signals $P_A$–$P_E$.

Upon receiving the pulse light emitted by LED 23a according to the synchronous pulse signal $S_{V_S}$, the light detecting unit 25a delivers a light detection signal or a pulse with its duration in accordance with the intensity of light received. The light detection signal is supplied to the light detection control circuit 26. The control circuit 26 determines that the pulse light emitted according to the synchronous signal $P_{A_S}$ has been received, when the duration of the light detection signal is equal to or above a set time for detection of the synchronous signal $P_{A_S}$. Based on the determination, the control circuit 26 accepts the light detection signals from the light detecting units 25b–25e in synchronism with the cycle of the light emitting operation. Consequently, the pulse light emitted in the light-emitting operation of each LED 23a–23e is received by the corresponding light detecting unit 25a–25e in synchronism with the emission of light.

Figure 5A:
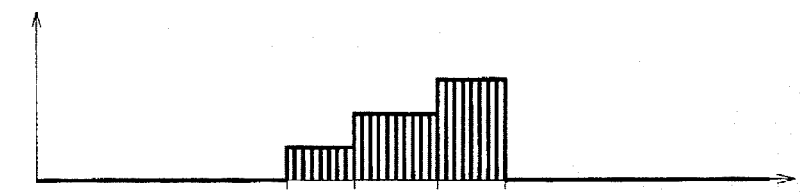
FIGS. 5A to 5F are timing charts showing output state of signals in a light detecting section of the photoelectric switch.
Figure 5B:
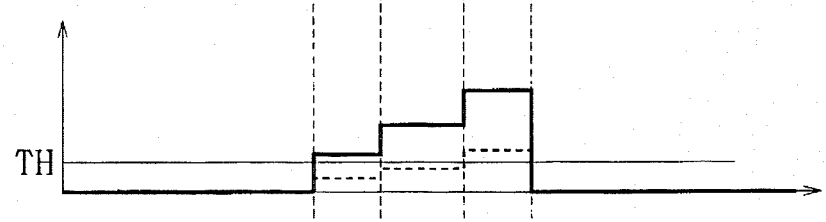
Figure 5C:
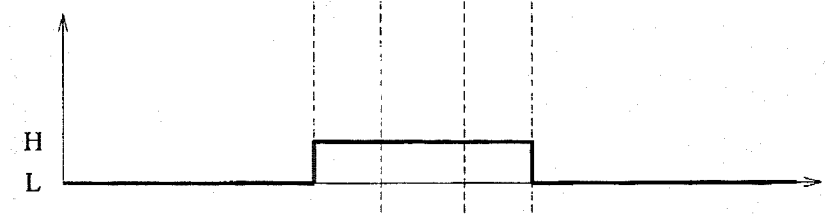
Figure 5D:
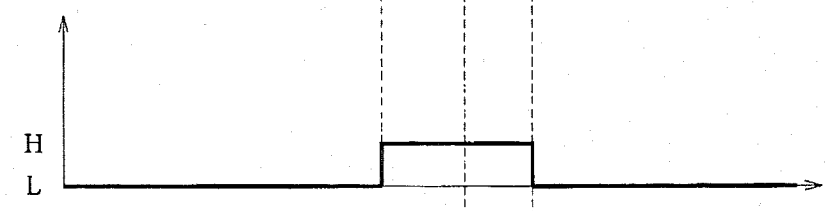
Figure 5E:
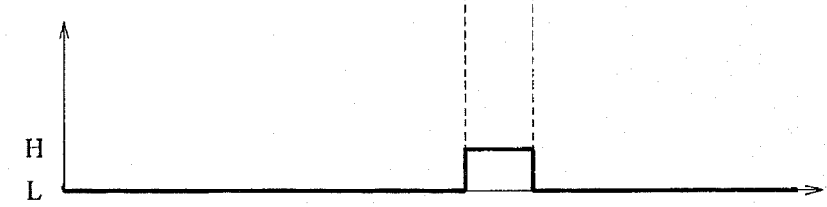
Figure 5F:
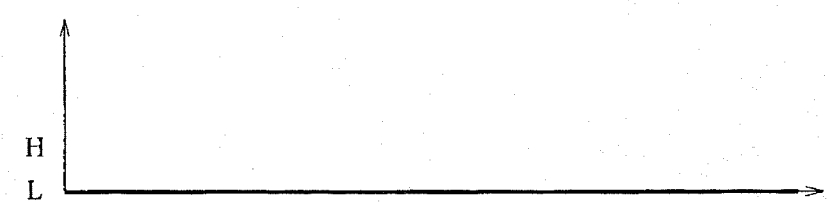

FIG. 5A shows a step-wise waveform of the pulse light emitted by each LED 23a–23e and received by each corresponding light detecting unit 25a–25e. FIG. 5B shows an analog signal with an integral value obtained in accordance with intensity of light received by each light detecting unit 25a–25e. Each light detecting unit 25a–25e delivers a light detection signal having any one of output times shown in FIGS. 5C–5F in accordance with the intensity of received light. For example, consider the case where the analog signal shown by solid line in FIG. 5B is obtained. Since the signal level exceeds the threshold TH at all of the three stages in this case, the light detection signal having the output time as shown in FIG. 5C is supplied to the light detection control circuit 26. On the other hand, when the analog signal shown by broken line in FIG. 5B is obtained, the signal level reaches and exceeds the threshold TH at the last stage. In this case, the light detection signal having the output time as shown in FIG. 5E is supplied to the control circuit 26. Furthermore, when an object interrupting one or more optical detecting-paths is present, no light detection signal is delivered by the light detecting units corresponding to the interrupted optical detecting paths. In this case, the high-level light detection signal is not supplied to the light detection control circuit 26, as shown in FIG. 5F, whereby the control circuit 26 detects presence of the object. Based on the determination program, the light detection control circuit 26 determines output times of the above-described light detection signals input thereto. The control circuit 26 delivers the first light-quantity indicative signal indicative of the light detection state when the duration of the input signal is equal to or above the predetermined value. The control circuit 26 detects interruption of the object when the light detection signal is obtained even with regard to only one of the optical detecting paths, whereby the operation indicating lamp 27 is turned on and an object detection signal is supplied to the output circuit 29. Furthermore, the light detection control circuit 26 delivers the stable operation signal serving as the second light-quantity indicative signal when the durations of the light detection signals from all the light detecting units 25a–25e are sufficiently long and stable. The stable operation signal is supplied to the stable operation indicating lamp 28 to turn it on.

According to the second embodiment, the light detecting units 25a–25e are each arranged not to be easily affected adversely by the external electrical noise and moreover, by the extraneous light, as in the first embodiment. Furthermore, the different light detection states including the optical detecting path interrupted state and the stable light detection state can be determined.

The light detection state is determined on the basis of the output durations of the light detection signals or the pulses and the first and second light-quantity indicative signals are delivered in the above-described embodiments. In a modified form, however, the light detection state may be determined on the basis of a period of time between the time of generation of the synchronous signal $PA_s$ and a rise time of each of the light detection pulses delivered from the respective light detecting units 25a–25e as shown in FIGS. 5C–5E. In the case where the intensity of light emitted by the light emitting means is excessively intensive, the integral value is sometimes reduced when the amplifying circuit amplifying the signal indicative of the received light is saturated. Consequently, output of the light detection pulse is halted in the midst of the light emitting operation even though the light having sufficient intensity is received by a light receiving element such as a photodiode. Accordingly, the pulse width cannot be determined. In the modified form, however, the above-described disadvantage can be eliminated.

Although the carrier pulse signal employed in each of the above-described embodiments is a high frequency signal, it may be a low frequency signal.

The foregoing description and drawings are merely illustrative of the principles of the present invention and are not to be construed in a limiting sense. Various changes and modifications will become apparent to those of ordinary skill in the art. All such changes and modification are seen to fall within the true spirit and scope of the invention as defined by the appended claims.

I claim:

1. A photoelectric switch comprising:
    a) light emitting means comprising:
        light-emitting pulse signal generating means comprising a first circuit delivering a main pulse having a predetermined duration and an amplitude which is gradually increased, a second circuit delivering a carrier pulse signal having a predetermined amplitude, and a third circuit delivering a light-emitting pulse signal having a waveform approximately the same as that of a signal obtained by amplitude-modulating the carrier pulse signal by means of the main pulse; and
        means for converting the light-emitting pulse signal to a light signal;
    b) light detecting means comprising:
        converting means for detecting the light signal delivered from the light emitting means and converting the received light signal to an electric signal;
        integrating means for integrating the electric signal delivered from the converting means, thereby delivering a signal having an integral value; and
        comparing means for comparing the signal delivered from the integrating means with a reference value, thereby obtaining a light detection pulse having a duration corresponding to a period of a signal component exceeding the reference value; and
    c) a determination section for determining a duration of the light detection pulse delivered from the light detecting means, thereby generating first and second light-quantity indicative signals in accordance with the determined duration of the light detection pulse, the determination section comprising first determining means having a first determining value and second determining means having a second determining value which is longer than the first determining value, the first determining means comparing the light detection pulse with the first determining value, thereby delivering the first light-quantity indicative signal when the duration of the light detection pulse is equal to or longer than the first determining value, the second determining means comparing the light detection pulse with the second determining value, thereby delivering the second light-quantity indicative signal when the duration of the light detection pulse is equal to or longer than the second determining value.

2. A photoelectric switch according to claim 1, wherein the third circuit obtains the light-emitting pulse signal by amplitude-modulating the carrier pulse signal by means of the main pulse.

3. A photoelectric switch according to claim 2, wherein the main pulse signal has a triangular waveform.

4. A photoelectric switch according to claim 2, wherein the main pulse signal has a step-wise waveform.

5. A photoelectric switch according to claim 1, wherein the light detecting means is integrated into one-chip configuration.

6. A photoelectric switch according to claim 1, wherein the main pulse signal has a triangular waveform.

7. A photoelectric switch according to claim 1, wherein the main pulse signal has a step-wise waveform.

8. A photoelectric switch comprising:
a) light emitting means comprising:
   light emitting pulse signal delivering means comprising a first circuit delivering a main pulse having a predetermined duration and an amplitude which is gradually increased, a second circuit delivering a carrier pulse signal having a predetermined amplitude, and a third circuit delivering first and second light-emitting pulse signals each having a phase different from the other and a waveform approximately the same as that of a signal obtained by amplitude-modulating the carrier pulse signal by means of the main pulse; and
   means for converting the first and second light-emitting pulse signals to first and second light signals respectively;
b) light detecting means comprising:
   converting means for detecting the first and second light signals delivered from the light emitting means and converting the received light signals to first and second electric signals respectively;
   integrating means for integrating each of the first and second electric signals delivered from the converting means, thereby delivering first and second signals having respective integral values; and
   comparing means for comparing each of the first and second signals delivered from the integrating means with a reference value, thereby obtaining first and second light detection pulses each having a duration corresponding to a period of a signal component exceeding the reference value; and
c) a determination section for determining durations of the respective first and second light detection pulses delivered from the light detecting means, thereby generating first and second light-quantity indicative signals in accordance with the determined durations of the respective first and second light detection pulses, the determination section comprising determining means into which the first and second light detection pulses are input, the determining means having a first determining value and a second determining value longer than the first determining value, the determining means comparing each of the light detection pulses with each of the first and second determining values, thereby delivering the first light-quantity indicative signal when the duration of either the first or second light detection pulse is equal to or longer than the first determining value and delivering the second light-quantity indicative signal when the duration of either the first or second light detection pulse is equal to or longer than the second determining value.

* * * * *